US011935858B2

(12) United States Patent
Baek

(10) Patent No.: US 11,935,858 B2
(45) Date of Patent: Mar. 19, 2024

(54) SEMICONDUCTOR DEVICES INCLUDING SEED STRUCTURE AND METHOD OF MANUFACTURING THE SEMICONDUCTOR DEVICES

(71) Applicant: Samsung Electronics Co., Ltd., Suwon-si (KR)

(72) Inventor: Seungmin Baek, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 424 days.

(21) Appl. No.: 17/077,646

(22) Filed: Oct. 22, 2020

(65) Prior Publication Data
US 2021/0320079 A1    Oct. 14, 2021

(30) Foreign Application Priority Data

Apr. 10, 2020   (KR) .................. 10-2020-0043953

(51) Int. Cl.
*H01L 23/00* (2006.01)
*H01L 21/48* (2006.01)
(Continued)

(52) U.S. Cl.
CPC .......... *H01L 24/20* (2013.01); *H01L 21/4853* (2013.01); *H01L 21/4857* (2013.01); *H01L 21/568* (2013.01); *H01L 23/13* (2013.01); *H01L 23/3128* (2013.01); *H01L 23/49816* (2013.01); *H01L 23/5383* (2013.01); *H01L 23/5386* (2013.01); *H01L 23/5389* (2013.01); *H01L 24/19* (2013.01); *H01L 25/105* (2013.01); *H01L 25/50* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/0401* (2013.01);
(Continued)

(58) Field of Classification Search
CPC ................. H01L 2224/05557; H01L 2224/05563–05566; H01L 2224/0558–05584; H01L 2224/05017; H01L 2224/0401; H01L 2224/05016–005019
See application file for complete search history.

(56) References Cited

U.S. PATENT DOCUMENTS 5,656,858 A * 8/1997 Kondo .................. H01L 24/11
   257/737
6,462,426 B1 * 10/2002 Kelkar .................. H01L 24/05
   257/781
(Continued)

FOREIGN PATENT DOCUMENTS

KR      100340852 B1   10/2002
KR      20050060604 A   6/2005
(Continued)

*Primary Examiner* — Brigitte A Paterson
(74) *Attorney, Agent, or Firm* — Muir Patent Law, PLLC

(57) ABSTRACT

A semiconductor device may include a seed structure on a complex structure. The seed structure may include a first barrier layer, a first seed layer on the first barrier layer, a second barrier layer on the first seed layer, and a second seed layer on the second barrier layer. The second barrier layer may contact a side surface of at least one of the first barrier layer and the first seed layer. An electrode layer may be disposed on the seed structure.

9 Claims, 13 Drawing Sheets

(51) Int. Cl.
    *H01L 21/56*     (2006.01)
    *H01L 23/13*     (2006.01)
    *H01L 23/31*     (2006.01)
    *H01L 23/498*     (2006.01)
    *H01L 23/538*     (2006.01)
    *H01L 25/00*     (2006.01)
    *H01L 25/10*     (2006.01)

(52) U.S. Cl.
CPC ............ *H01L 2224/04105* (2013.01); *H01L 2224/12105* (2013.01); *H01L 2224/131* (2013.01); *H01L 2224/16227* (2013.01); *H01L 2224/2101* (2013.01); *H01L 2224/2105* (2013.01); *H01L 2224/211* (2013.01); *H01L 2224/214* (2013.01); *H01L 2224/215* (2013.01); *H01L 2224/32225* (2013.01); *H01L 2224/73204* (2013.01); *H01L 2224/73253* (2013.01); *H01L 2224/92125* (2013.01); *H01L 2225/1023* (2013.01); *H01L 2225/1035* (2013.01); *H01L 2225/1041* (2013.01); *H01L 2225/1058* (2013.01); *H01L 2924/01022* (2013.01); *H01L 2924/01027* (2013.01); *H01L 2924/01028* (2013.01); *H01L 2924/01029* (2013.01); *H01L 2924/01047* (2013.01); *H01L 2924/0105* (2013.01); *H01L 2924/01073* (2013.01); *H01L 2924/01074* (2013.01); *H01L 2924/0133* (2013.01); *H01L 2924/04941* (2013.01); *H01L 2924/04953* (2013.01); *H01L 2924/15311* (2013.01); *H01L 2924/1533* (2013.01); *H01L 2924/19107* (2013.01)

(56) References Cited

U.S. PATENT DOCUMENTS

| | | | |
|---|---|---|---|
| 7,001,641 | B2 | 2/2006 | Dubin et al. |
| 7,855,144 | B2 | 12/2010 | Kim et al. |
| 9,478,512 | B2 | 10/2016 | Hu |
| 2009/0035935 | A1 | 2/2009 | Kim et al. |
| 2012/0248605 | A1* | 10/2012 | Yamaguchi ............ H01L 24/03 257/737 |
| 2014/0102766 | A1 | 4/2014 | Kim et al. |
| 2016/0330757 | A1 | 11/2016 | Cherian et al. |
| 2018/0277485 | A1* | 9/2018 | Han ..................... H01L 21/56 |
| 2019/0027450 | A1* | 1/2019 | Choi ................... H01L 23/3135 |
| 2019/0148288 | A1 | 5/2019 | Tsou et al. |
| 2020/0279822 | A1* | 9/2020 | Matsuda ................ H01L 24/11 |

FOREIGN PATENT DOCUMENTS

| | | | |
|---|---|---|---|
| KR | 100726238 B1 | 6/2007 | |
| KR | 20100061021 A | 6/2010 | |
| KR | 20140047967 A | 4/2014 | |
| KR | 102040124 B1 | 11/2019 | |
| WO | WO-2020213133 A1 * | 10/2020 | |

\* cited by examiner

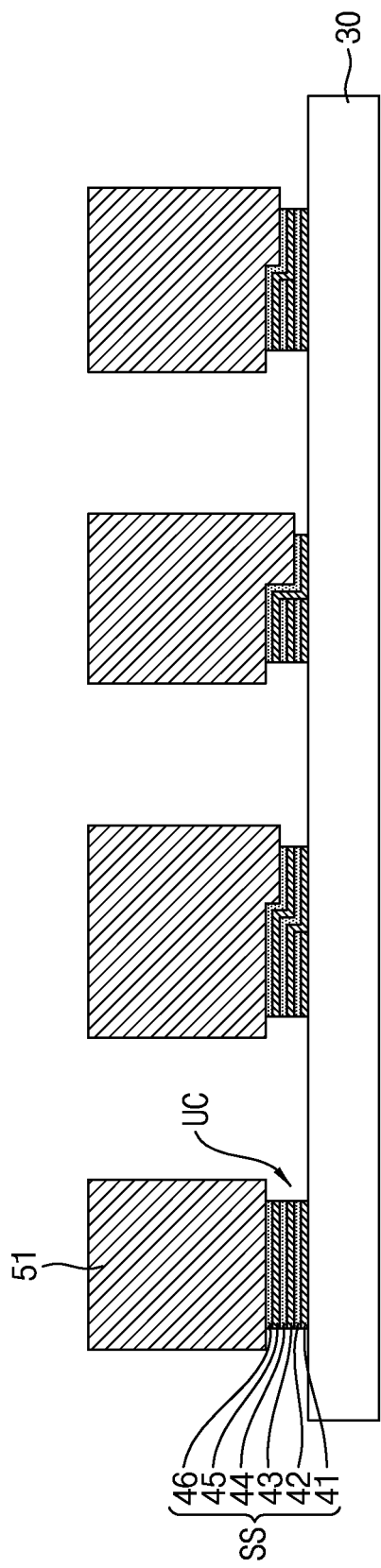
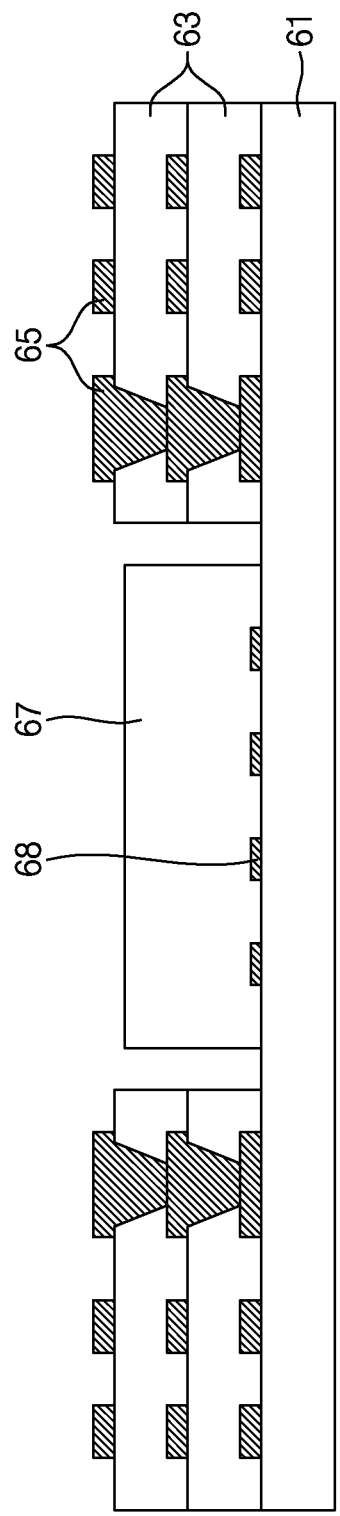

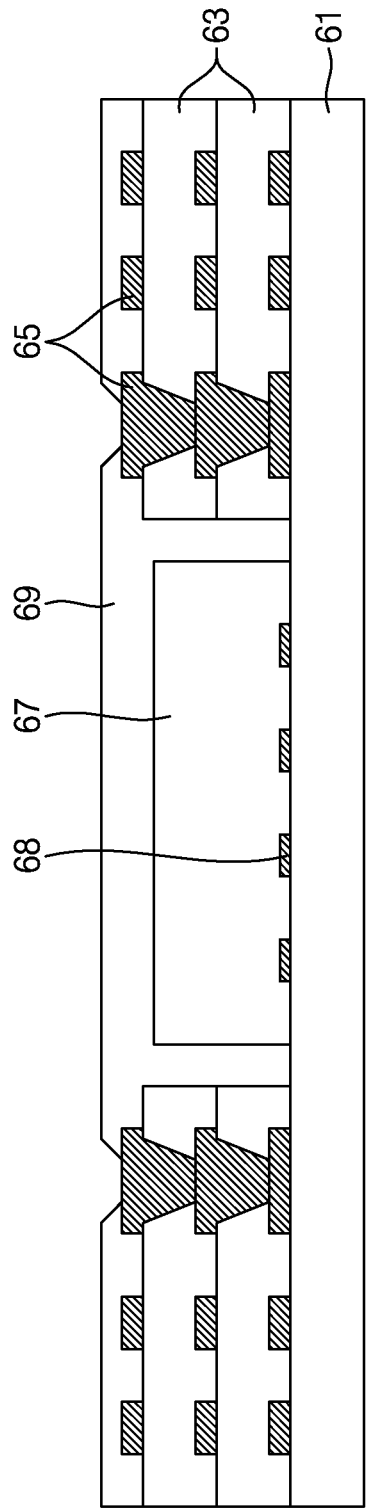
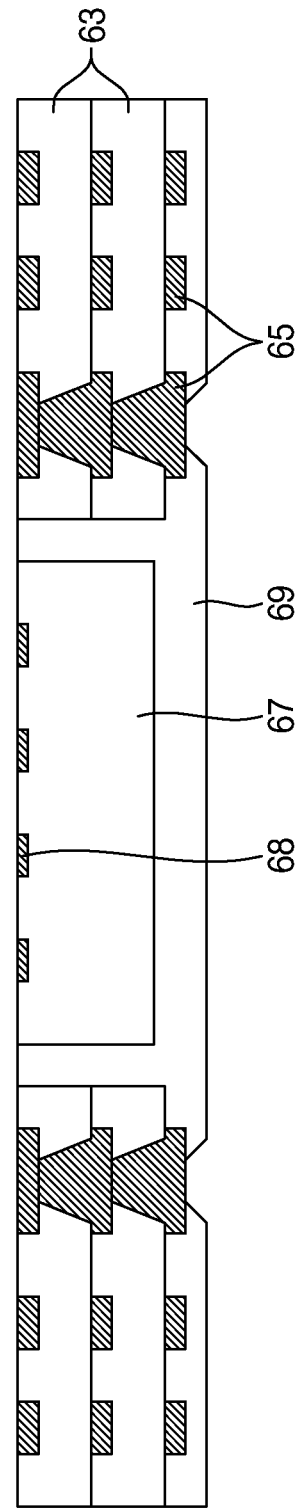

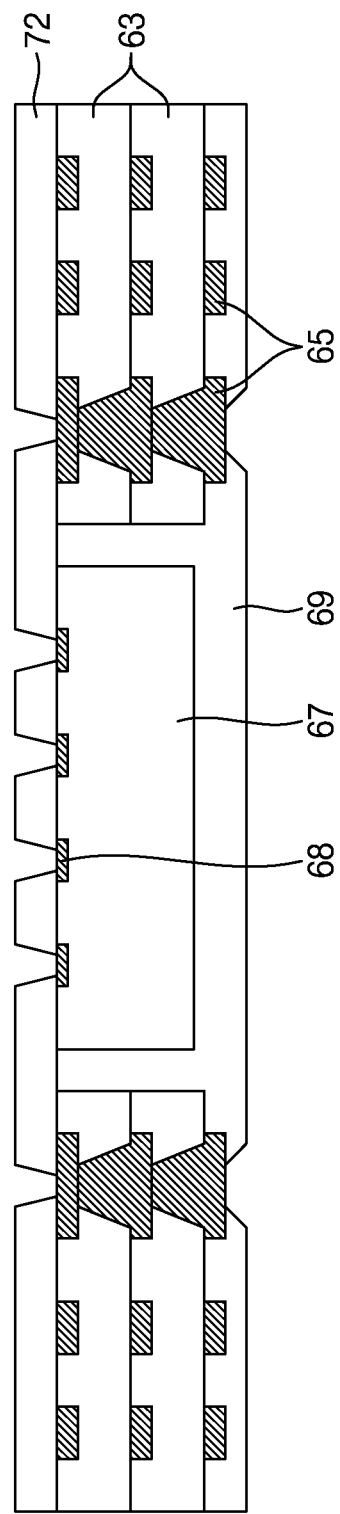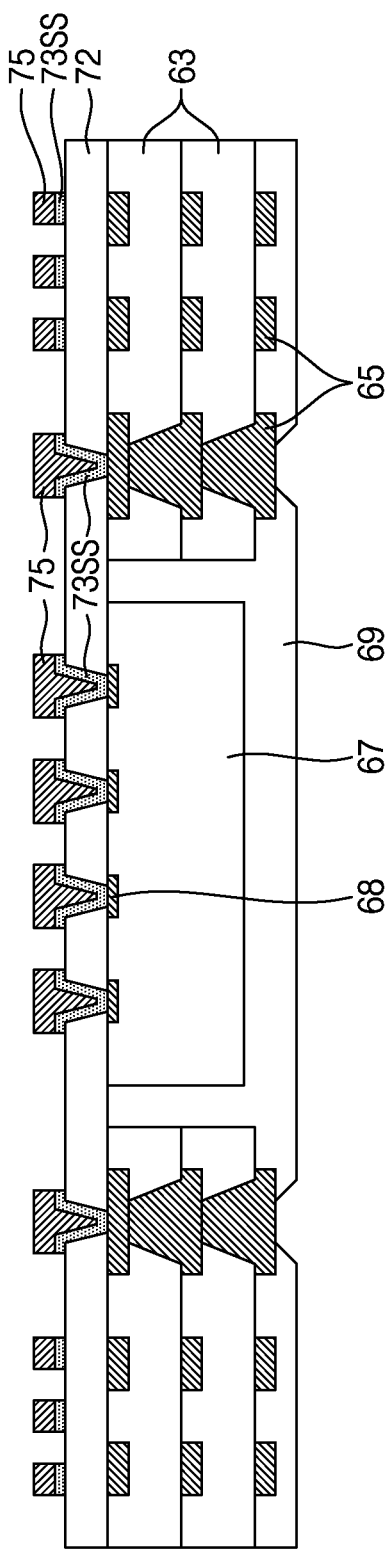

US 11,935,858 B2

SEMICONDUCTOR DEVICES INCLUDING SEED STRUCTURE AND METHOD OF MANUFACTURING THE SEMICONDUCTOR DEVICES

CROSS-REFERENCE TO THE RELATED APPLICATION

This U.S. non-provisional patent application claims priority from Korean Patent Application No. 10-2020-0043953, filed on Apr. 10, 2020, in the Korean Intellectual Property Office (KIPO), the disclosure of which is incorporated herein by reference in its entirety.

BACKGROUND

1. Field

The disclosure relates to a semiconductor device including a seed structure and a method of manufacturing the semiconductor device.

2. Description of the Related Art

As semiconductor devices are highly integrated, technology using a redistribution layer is being developed. The redistribution layer may include a seed layer and an electrode layer. A defect of the seed layer causes a defect such as a defect of the electrode layer.

SUMMARY

The exemplary embodiments of the disclosure provide semiconductor devices having an excellent electrical characteristic and a method of manufacturing the semiconductor devices.

A semiconductor device in accordance with embodiments of the disclosure may include a seed structure on a complex structure. The seed structure may include a first barrier layer, a first seed layer on the first barrier layer, a second barrier layer on the first seed layer, and a second seed layer on the second barrier layer. The second barrier layer may contact a side surface of at least one of the first barrier layer and the first seed layer. An electrode layer may be disposed on the seed structure. The term "contact," as used herein, refers to a direct connection (i.e., touching) unless the context indicates otherwise.

A method of manufacturing a semiconductor device in accordance with embodiments of the disclosure may include forming the seed structure on the complex structure. The forming of the seed structure may include forming a first barrier layer on the complex structure, forming a first seed layer on the first barrier layer, cleaning the complex structure including the first seed layer and the first barrier layer, forming a second barrier layer on the first seed layer, and forming a second seed layer on the second barrier layer. An electrode layer may be formed on the seed structure.

A semiconductor device in accordance with embodiments of the disclosure may include a seed structure on a complex structure. The seed structure may include a first barrier layer, a first seed layer on the first barrier layer, a second barrier layer on the first seed layer, a second seed layer on the second barrier layer, a third barrier layer on the second seed layer, and a third seed layer on the third barrier layer. The third barrier layer may contact a top surface and a side surface of the second seed layer, and the third barrier layer may contact a side surface of the second barrier layer. An electrode layer may be disposed on the seed structure.

A semiconductor device in accordance with embodiments of the disclosure may include a semiconductor chip including a plurality of chip pads. An encapsulant may be disposed on the semiconductor chip. At least one redistribution layer on the encapsulant and the semiconductor chip may be provided. A solder ball may be disposed on the at least one redistribution layer. The at least one redistribution layer may include a seed structure on the encapsulant. The seed structure may include a first barrier layer, a first seed layer on the first barrier layer, a second barrier layer on the first seed layer, and a second seed layer on the second barrier layer. The second barrier layer may contact a side surface of at least one of the first barrier layer and the first seed layer. An electrode may be provided on the seed structure.

BRIEF DESCRIPTION OF THE DRAWINGS

FIGS. 11 to 25 are cross-sectional views for describing methods of manufacturing semiconductor devices according to embodiments of the disclosure.

DETAILED DESCRIPTION OF EXEMPLARY EMBODIMENTS

FIGS. 1 to 8 are cross-sectional views for describing semiconductor devices according to embodiments of the disclosure. The semiconductor devices according to embodiments of the disclosure may include a wafer level package (WLP), a panel level package (PLP), a package on package (POP), or a combination thereof.

Figure 1:
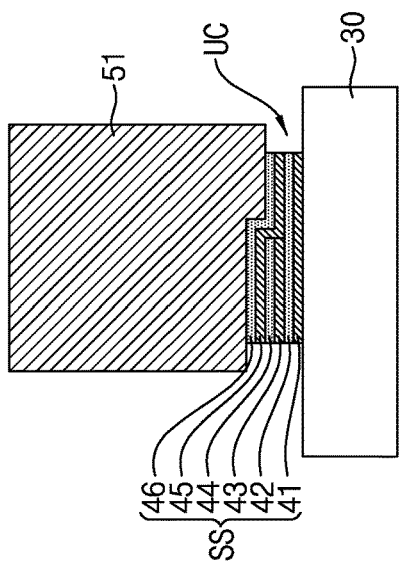
FIGS. 1 to 8 are cross-sectional views for describing semiconductor devices according to embodiments of the disclosure.

Referring to FIG. 1, a seed structure SS may be disposed on a complex structure 30. An electrode layer 51 may be disposed on the seed structure SS. An undercut area UC may be disposed between the complex structure 30 and the electrode layer 51. A side surface of the seed structure SS may be exposed at an inner portion of the undercut area UC. For example, the seed structure SS may be recessed with respect to the complex structure 30 and the electrode layer 51. The seed structure SS may have a horizontal width in a first direction which is narrower than a width of the electrode layer 51 in the first direction.

The seed structure SS may include a first barrier layer 41, a first seed layer 42 on the first barrier layer 41, a second barrier layer 43 on the first seed layer 42, a second seed layer 44 on the second barrier layer 43, a third barrier layer 45 on the second seed layer 44, and a third seed layer 46 on the third barrier layer 45. A bottom surface of the first barrier layer 41 may contact a top surface of the complex structure 30. The second barrier layer 43 may contact the top surface of the complex structure 30, a side surface of the first barrier layer 41, and a side surface and a top surface of the first seed layer 42. Lowermost surfaces of the first barrier layer 41 and the second barrier layer 43 may be substantially coplanar. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially planar," may be exactly planar or may be planar within acceptable variations that may occur, for example, due to manufacturing processes.

In an embodiment, the seed structure SS may have a thickness, in a direction perpendicular to the top surface of the complex structure 30, of about 4 nm to about 600 nm. Each of the first barrier layer 41, the second barrier layer 43, and the third barrier layer 45 may have a thickness of about 1 nm to about 150 nm. Each of the first seed layer 42, the second seed layer 44, and the third seed layer 46 may have a thickness of about 1 nm to about 150 nm.

Figure 2:
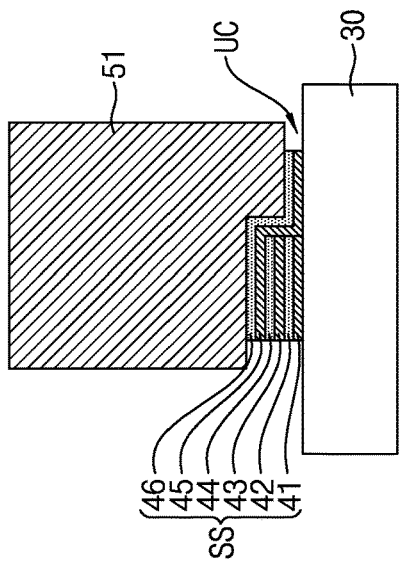

Referring to FIG. 2, the third barrier layer 45 may contact a top surface of the second seed layer 44, the top surface of the complex structure 30, the side surface of the first barrier layer 41, the side surface of the first seed layer 42, a side surface of the second barrier layer 43, and a side surface of the second seed layer 44.

Figure 3:
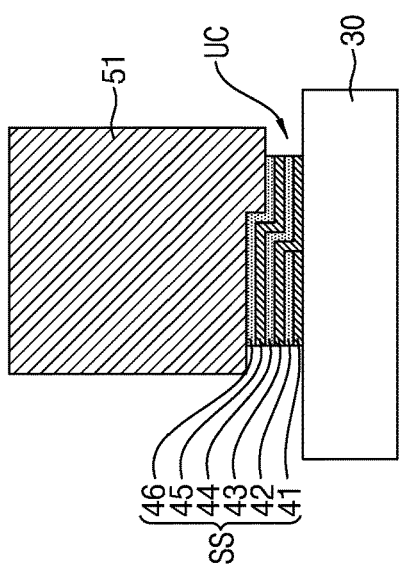

Referring to FIG. 3, the third barrier layer 45 may contact the top surface of the first seed layer 42, the side surface of the second barrier layer 43, and a side surface of the second seed layer 44.

Figure 4:
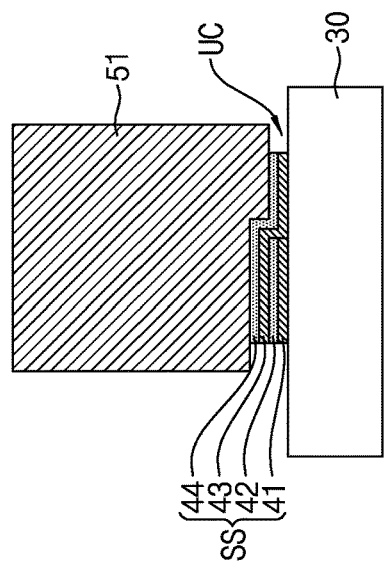

Referring to FIG. 4, a seed structure SS may include a first barrier layer 41, a first seed layer 42 on the first barrier layer 41, a second barrier layer 43 on the first seed layer 42, a second seed layer 44 on the second barrier layer 43, a third barrier layer 45 on the second seed layer 44, and a third seed layer 46 on the third barrier layer 45.

Figure 5:
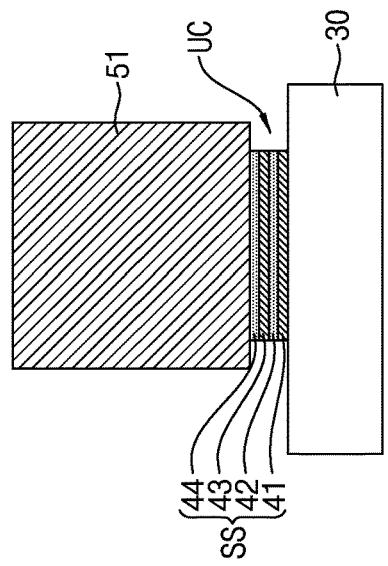

Referring to FIG. 5, a seed structure SS may include a first barrier layer 41, a first seed layer 42 on the first barrier layer 41, a second barrier layer 43 on the first seed layer 42, and a second seed layer 44 on the second barrier layer 43.

Figure 6:
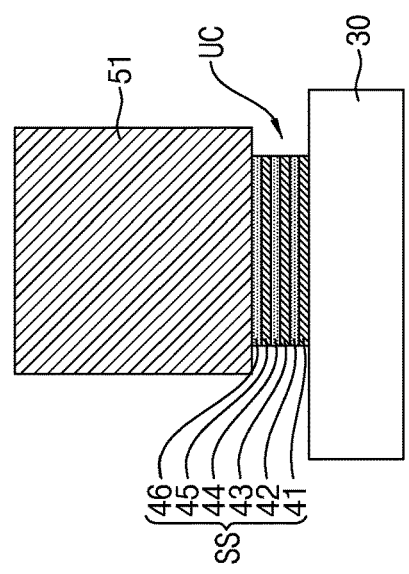

Referring to FIG. 6, a second barrier layer 43 may contact a top surface of a complex structure 30, a side surface of a first barrier layer 41, and a side surface and a top surface of a first seed layer 42. A second seed layer 44 may be disposed on the second barrier layer 43. An electrode layer 51 may be disposed on the second seed layer 44.

Figure 7:
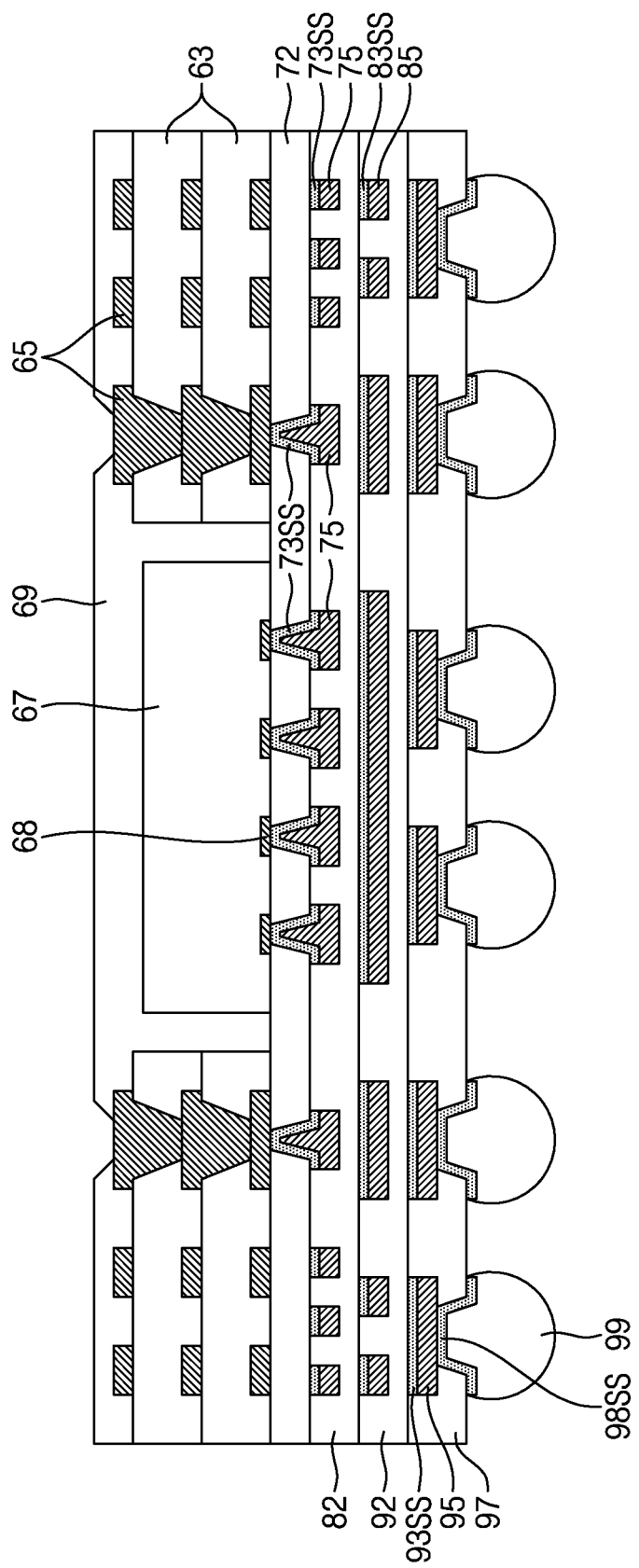

Referring to FIG. 7, a semiconductor chip 67 may be equipped in a package substrate 63. An encapsulant 69 may be disposed on the semiconductor chip 67 and the package substrate 63. The encapsulant 69 may extend to a portion between the semiconductor chip 67 and the package substrate 63. Bottom surfaces of the package substrate 63, the semiconductor chip 67, and the encapsulant 69 may be substantially coplanar. In an embodiment, the package substrate 63, the semiconductor chip 67, and the encapsulant 69 may correspond to a complex structure.

A first redistribution layer including a plurality of first layers 72, 73SS, and 75 may be disposed on the bottom surfaces of the package substrate 63, the semiconductor chip 67, and the encapsulant 69. The plurality of first layers 72, 73SS, and 75 may include a first insulation layer 72, a first seed structure 73SS, and a first electrode layer 75. A second redistribution layer including a plurality of second layers 82, 83 SS, and 85 may be disposed on a bottom surface of the first redistribution layer that includes layers 72, 73SS, and 75. The plurality of second layers 82, 83SS, and 85 may include a second insulation layer 82, a second seed structure 83SS, and a second electrode layer 85.

A third redistribution layer including a plurality of third layers 92, 93SS, and 95 may be disposed on a bottom surface of the second redistribution layer that includes layers 82, 83SS, and 85. The plurality of third layers 92, 93SS, and 95 may include a third insulation layer 92, a third seed structure 93SS, and a third electrode layer 95. A fourth redistribution layer including a plurality of fourth layers 97, 98SS, and 99 may be disposed on a bottom surface of the third redistribution layer that includes layers 92, 93SS, and 95. The plurality of fourth layers 97, 98SS, and 99 may include a fourth insulation layer 97, a fourth seed structure 98SS, and a fourth electrode layer 99. The first seed structure 73SS, the first electrode layer 75, the second seed structure 83SS, the second electrode layer 85, the third seed structure 93SS, the third electrode layer 95, the fourth seed structure 98SS, and the fourth electrode layer 99 may each include a configuration which is similar to the configurations described above with reference to FIGS. 1 to 6.

Figure 8:
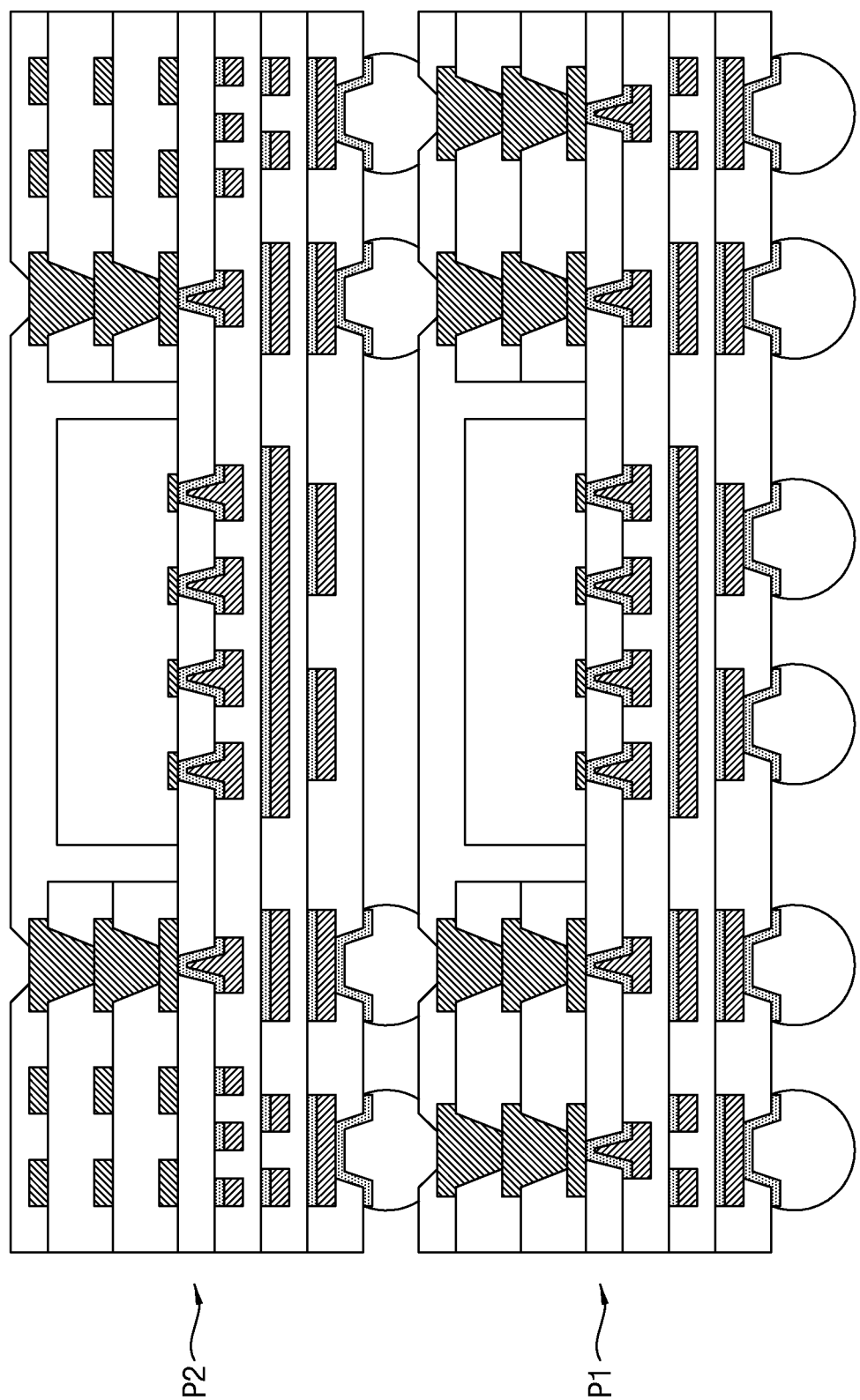

Referring to FIG. 8, a second semiconductor package P2 may be stacked on a first semiconductor package P1. Each of the first semiconductor package P1 and the second semiconductor package P2 may include a configuration which is similar to the configurations described above with reference to FIGS. 1 to 7.

Figure 10:
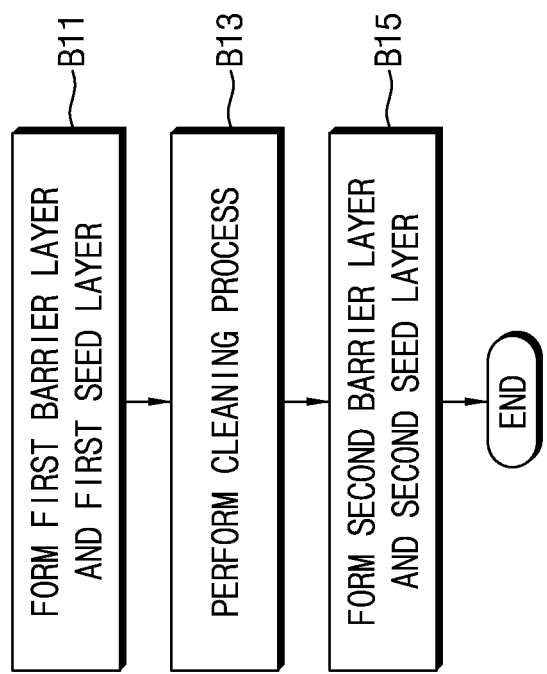
FIGS. 9 and 10 are flowcharts for describing methods of manufacturing semiconductor devices according to embodiments of the disclosure.
Figure 9:
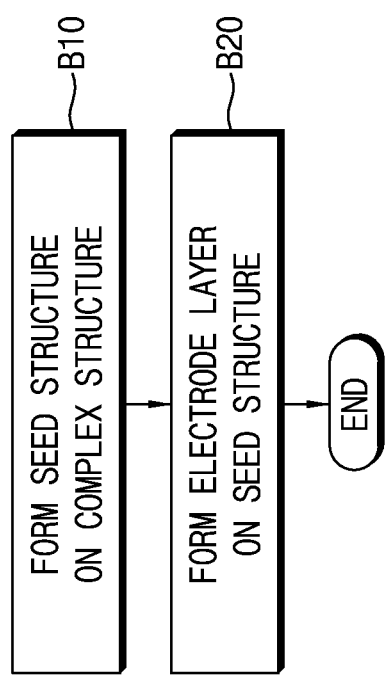

FIGS. 9 and 10 are flowcharts for describing methods of manufacturing semiconductor devices according to embodiments of the disclosure.

Referring to FIG. 9, the methods of manufacturing the semiconductor devices according to embodiments of the disclosure may include a process (B10) of forming a seed structure on a complex structure and a process (B20) of forming an electrode layer on the seed structure.

Referring to FIG. 10, the process (B10) of forming the seed structure may include a process (B11) of forming a first barrier layer and a first seed layer, a process (B13) of performing a cleaning process, and a process (B15) of forming a second barrier layer and a second seed layer. In an embodiment, the process (B13) of performing the cleaning process and the process (B15) of forming the second barrier layer and the second seed layer may be repeatedly performed a plurality of times.

FIGS. 11 to 19 are cross-sectional views for describing methods of manufacturing semiconductor devices according to embodiments of the disclosure.

Figure 11:
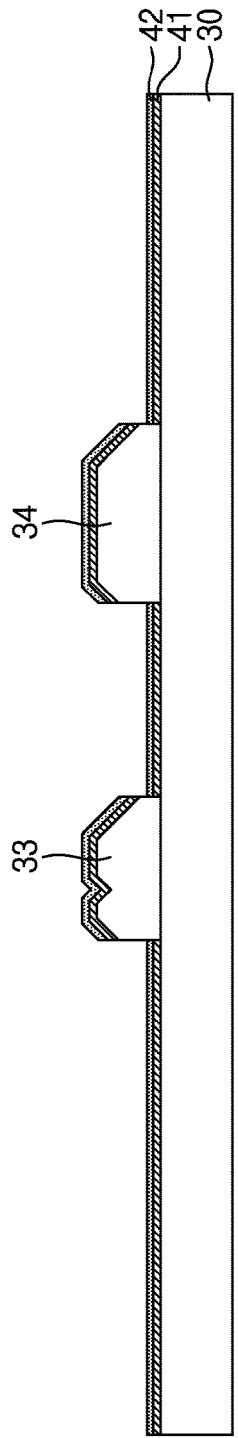

Referring to FIG. 11, a plurality of foreign materials 33 and 34 having various sizes and shapes may be adhered to a complex structure 30. The plurality of foreign materials 33 and 34 may include a first foreign material 33 and a second foreign material 34. A first barrier layer 41 and a second seed layer 42 may be formed on the complex structure 30 (B11).

The complex structure 30 may include various kinds of conductive patterns and/or insulating material layers. For example, the complex structure 30 may include a package substrate, a semiconductor chip, an encapsulant, or a combination thereof. The complex structure 30 may include a rigid printed circuit board (PCB), a flexible PCB, a rigid-flexible PCB, or a combination thereof.

The first barrier layer 41 may be formed on the complex structure 30. The first barrier layer 41 may contact top surfaces of the complex structure 30 and the plurality of foreign materials 33 and 34. The plurality of foreign materials 33 and 34 may be maintained between the complex structure 30 and the first barrier layer 41. The first seed layer 42 may be formed on the first barrier layer 41. The first seed layer 42 may cover the complex structure 30 and the plurality of foreign materials 33 and 34. The first barrier layer 41 may be interposed between the complex structure 30 and the first seed layer 42 and between the plurality of foreign materials 33 and 34 and the first seed layer 42. The first seed layer 42 contacts a top surface of the first barrier layer 41.

In an embodiment, each of the first barrier layer 41 and the first seed layer 42 may be formed by using a physical vapor deposition (PVD) process, a chemical vapor deposition (CVD) process, or a combination thereof. The first barrier layer 41 may be or may include a conductive material, such as titanium (Ti), titanium nitride (TiN), tantalum (Ta), tantalum nitride (TaN), or a combination thereof. The first barrier layer 41 may have the same material composition throughout. The first seed layer 42 may be or may include a conductive material, for example a metal, such as copper (Cu). The first seed layer 42 may have the same material composition throughout.

Figure 12:
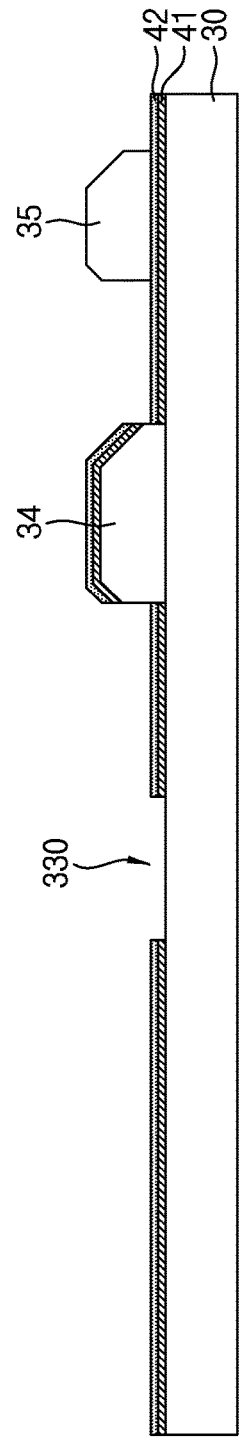

Referring to FIG. 12, the complex structure 30 including the first barrier layer 41 and the first seed layer 42 may be cleaned by using a first cleaning process (B13). Some of the plurality of foreign materials 33 and 34 may be removed during cleaning the complex structure 30. For example, a first opening portion 330 may be formed by removing the first foreign material 33. The top surface of the complex structure 30 may be exposed at a floor of the first opening portion 330. Side surfaces of the first barrier layer 41 and the first seed layer 42 may be exposed at sidewalls of the first opening portion 330. In an embodiment, a third foreign material 35 may be adhered to the first seed layer 42 during cleaning the complex structure 300.

In an embodiment, the first cleaning process may include a wet cleaning process using a wet cleaner such as tetramethylammonium hydroxide (TMAH), deionized (DI) water, or a combination thereof.

Figure 13:
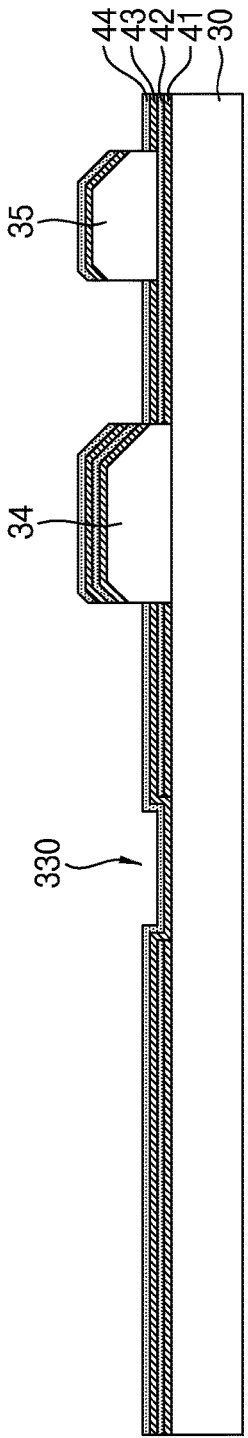

Referring to FIG. 13, a second barrier layer 43 and a second seed layer 44 may be formed on the first seed layer 42 (B15).

The second barrier layer 43 may be formed on the first seed layer 42. The second barrier layer 43 may contact a top surface of the first seed layer 42. The second barrier layer 43 may cover the floor and the sidewalls of the first opening portion 330. Consequently, the second barrier layer 43 may contact the top surface of the complex structure 30, the side surface of the first barrier layer 41, and the side surface of the first seed layer 42 at the first opening portion 330. The second seed layer 44 may be formed on the second barrier layer 43. The second seed layer 44 may contact a top surface of the second barrier layer 43.

In an embodiment, each of the second barrier layer 43 and the second seed layer 44 may be formed by using a PVD process, a CVD process, or a combination thereof. The second barrier layer 43 may include or may be formed of Ti, TiN, Ta, TaN, or a combination thereof. The second seed layer 44 may include or may be formed of Cu.

Figure 14:
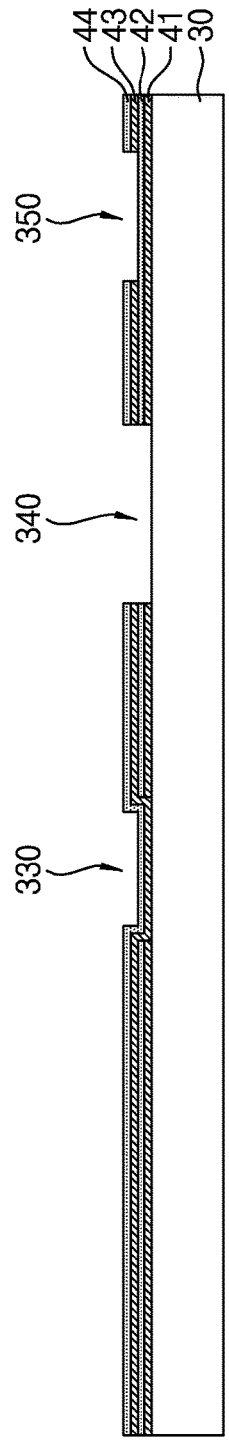

Referring to FIG. 14, the complex structure 30 including the first barrier layer 41, the first seed layer 42, the second barrier layer 43, and the second seed layer 44 may be cleaned by using a second cleaning process. A second opening portion 340 may be formed by removing the second foreign material 34. A third opening portion 350 may be formed by removing the third foreign material 35.

A top surface of the complex structure 30 may be exposed at a floor of the second opening portion 340. Side surfaces of the first barrier layer 41, the first seed layer 42, the second barrier layer 43, and the second seed layer 44 may be exposed at sidewalls of the second opening portion 340. A top surface of the first seed layer 42 may be exposed at a floor of the third opening portion 350. The side surfaces of the second barrier layer 43 and the second seed layer 44 may be exposed at sidewalls of the third opening portion 350.

In an embodiment, the second cleaning process may include a wet cleaning process using a wet cleaner such as TMAH, DI water, or a combination thereof.

Figure 15:
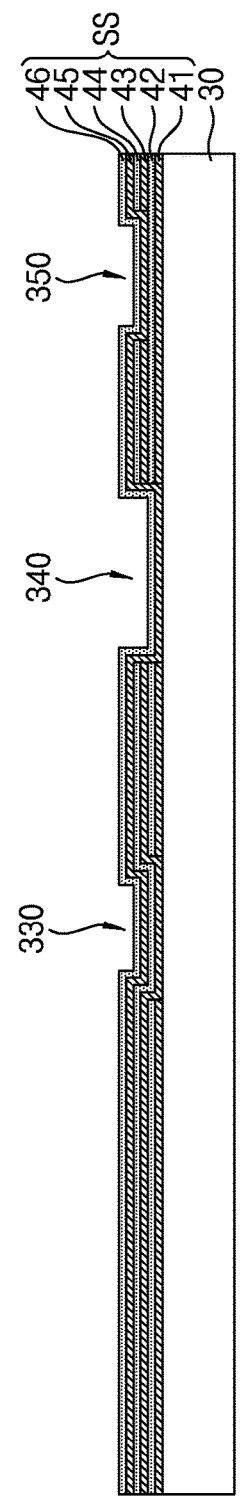

Referring to FIG. 15, a third barrier layer 45 and a third seed layer 46 may be formed on the second seed layer 44. The first barrier layer 41, the first seed layer 42, the second barrier layer 43, the second seed layer 44, the third barrier layer 45, and the third seed layer 46 may configure a seed structure SS.

A portion of the third barrier layer 45 may be formed on the second seed layer 44 and may contact a top surface of the second seed layer 44. A portion of the third barrier layer 45 may cover the floor and sidewalls of the second opening portion 340 and may contact a top surface of the complex structure 30, a side surface of the first barrier layer 41, a side surface of the first seed layer 42, a side surface of the second barrier layer 43, and a side surface of the second seed layer 44.

A portion of the third barrier layer 45 may cover a floor and sidewalls of the third opening portion 350 and may contact a top surface of the first seed layer 42, a side surface of the second barrier layer 43, and a side surface of the second seed layer 44.

The third seed layer 46 may be formed on the third barrier layer 45. The third seed layer 46 may contact a top surface of the third barrier layer 45.

In an embodiment, each of the third barrier layer 45 and the third seed layer 46 may be formed by using a PVD process, a CVD process, or a combination thereof. The third barrier layer 45 may include or may be formed of Ti, TiN, Ta, TaN, or a combination thereof. The third seed layer 46 may include or may be formed of Cu.

Figure 16:
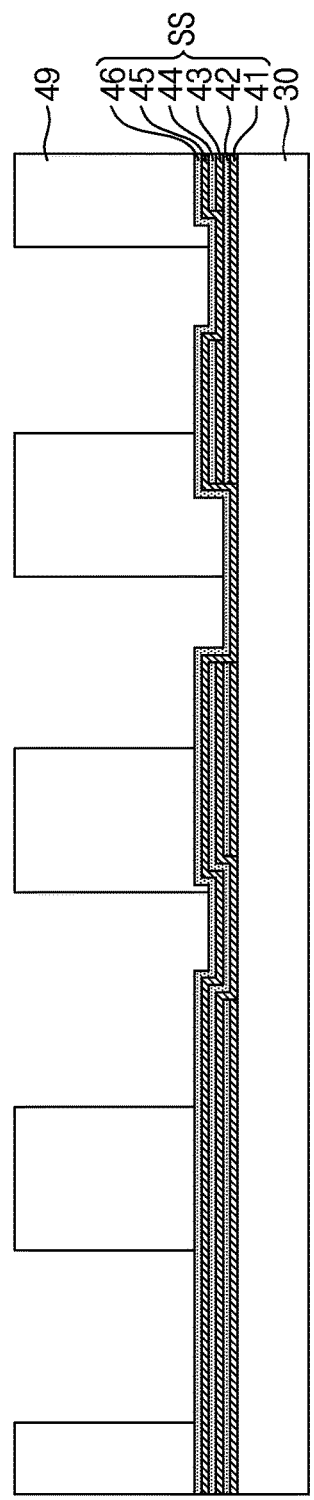

Referring to FIG. 16, a sacrificial mask layer 49 may be formed on the seed structure SS. The sacrificial mask layer 49 may include a photosensitive material such as dry film (DF) or photoresist (PR). The sacrificial mask layer 49 may be initially formed on an entire top surface of the seed structure, and then may be patterned, for example using photolithography, to form a mask pattern. The mask pattern may include mask portions that cover step portions of the seed structure.

Figure 17:
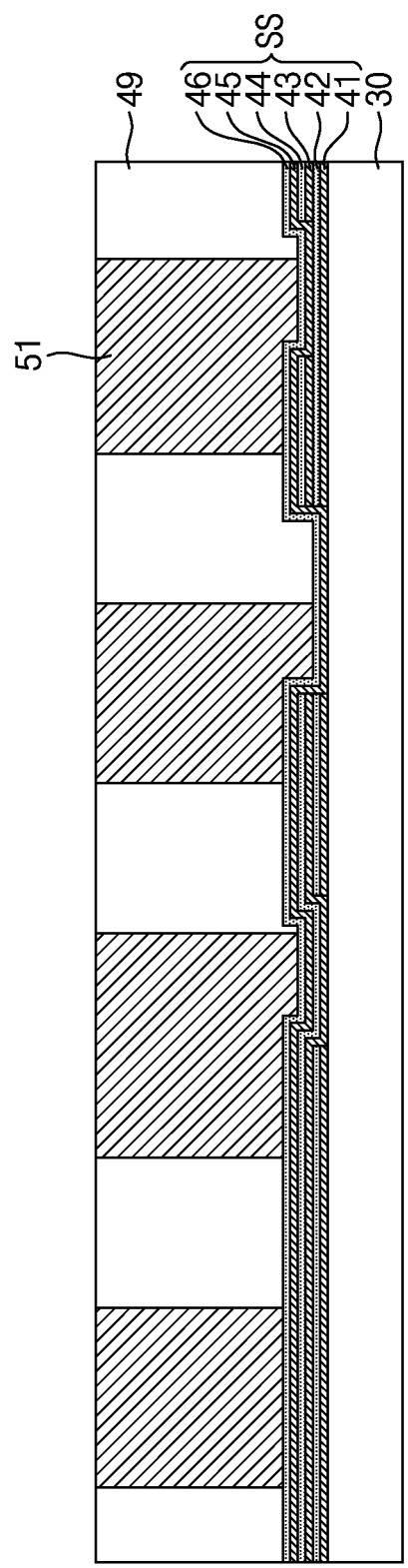

Referring to FIG. 17, an electrode layer 51 may be formed on the seed structure SS by using an electroplating process. For example, the electrode layer 51 may fill in the openings created by the mask pattern toward or up to the top of the openings. The electrode layer 51 may include or may be formed of Cu, nickel (Ni), tin-silver-copper (Sn—Ag—Cu), cobalt (Co), tungsten (W), or a combination thereof.

Figure 18:
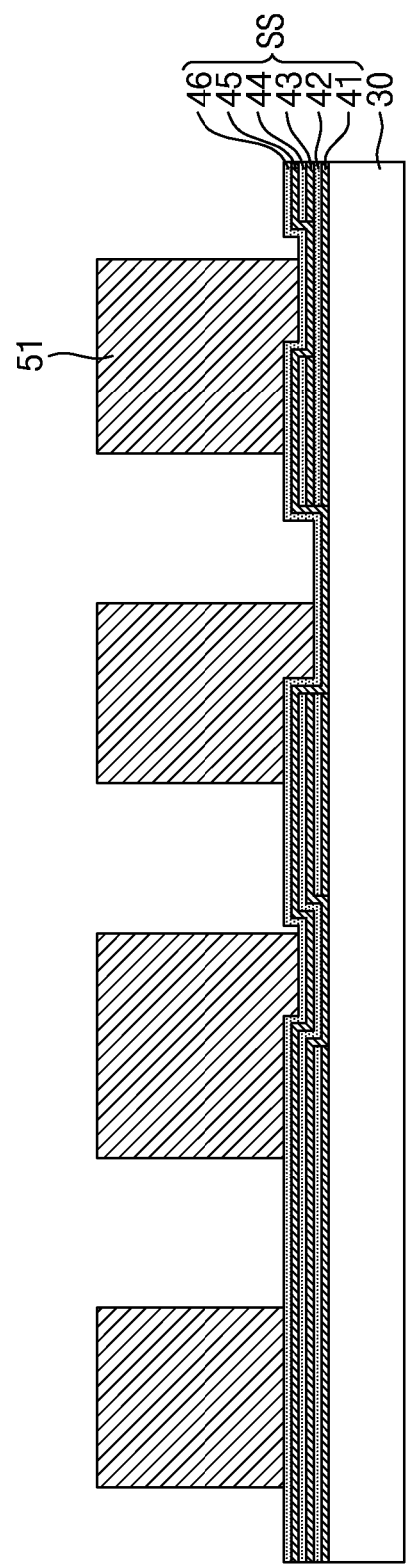

Referring to FIG. 18, a top surface of the seed structure SS may be partially exposed by removing the sacrificial mask layer 49.

Referring to FIG. 19, top surfaces of the complex structure 30 may be partially exposed by partially removing the seed structure SS. An undercut area UC may be formed between the complex structure 30 and the electrode layer 51 (B20). Side surfaces of the seed structure SS may be exposed at an inner portion of the undercut area UC. As can be seen in FIG. 19, as a result of the above process, for different electrodes of electrode layer 51, the seed structure SS may have a different shape. For example, from a cross-sectional view, one seed structure SS may have a rectangular shape, and other seed structure may have differently-structured step shapes, for example, having different lengths of the steps, and/or having different heights of the steps. For example, different electrodes of an electrode layer 51 formed in a first process at the same time as each other may cover and contact different shaped or sized seed structures SS formed in a second, earlier process at the same time as each other. Additionally, as illustrated in FIG. 19, one or more electrodes of the electrode layer 51 may have a bottom surface formed with a step shape corresponding to the respective seed structure in contact with the one or more electrodes.

FIGS. 20 to 25 are cross-sectional views for describing methods of manufacturing semiconductor devices according to embodiments of the disclosure.

Referring to FIG. 20, a package substrate 63 and a semiconductor chip 67 may be adhered to a sacrificial substrate 61. The package substrate 63 may include a plurality of conductive patterns 65. The semiconductor chip 67 may include a plurality of chip pads 68.

In an embodiment, the package substrate 63 may be a fan-out substrate including a cavity. The package substrate 63 may include a rigid PCB, a flexible PCB, a rigid-flexible PCB, or a combination thereof. Each of the plurality of conductive patterns 65 and the plurality of chip pads 68 may include or may be formed of Cu, aluminum (Al), tungsten (W), Ni, Ti, TiN, Ta, TaN, Sn, Ag, Co, platinum (Pt), zirconium (Zr), ruthenium (Ru), or a combination thereof. The semiconductor chip 67 may be provided in the cavity of the package substrate 63.

Referring to FIG. 21, an encapsulant 69 may be formed between the semiconductor chip 67 and the package substrate 63. The encapsulant 69 may extend to a portion between the semiconductor chip 67 and the package substrate 63.

The encapsulant 69 may include an epoxy molding compound (EMC), an underfill, a nonconductive film (NCF), a nonconductive paste (NCP), a photosensitive material, or a combination thereof. In an embodiment, the encapsulant 69 may include an epoxy resin such as a thermocurable resin, a thermoplastic resin such as polyimide, or a resin where a reinforcing agent such as an inorganic filler is added thereto. For example, the encapsulant 69 may include or may be formed of ajinomoto build-up film (ABF), FR-4, bismaleimide triazine (BT), resin, or a combination thereof.

Referring to FIG. 22, surfaces of the package substrate 63, the semiconductor chip 67, and the encapsulant 69 may be exposed by removing the sacrificial substrate 61. In an embodiment, the package substrate 63, the semiconductor chip 67, and the encapsulant 69 may correspond to a complex structure, and may combine to form a coplanar surface. As illustrated in FIG. 22, the complex structure may be oriented in a flipped manner in contrast with FIG. 21.

Referring to FIG. 23, a first insulation layer 72 may be formed on the surfaces of the package substrate 63, the semiconductor chip 67, and the encapsulant 69. The first insulation layer may include or may be formed of silicon oxide, silicon nitride, silicon oxynitride, low-K dielectrics, high-K dielectrics, or a combination thereof. For example, the first insulation layer 72 may include or may be formed of photosensitive polyimide (PSPI), photoimageable dielectric (PID), ABF, or a combination thereof.

Referring to FIG. 24, a first seed structure 73SS and a first electrode layer 75 may be formed on the insulation layer 72. The first insulation layer 72, the first seed structure 73SS, and the first electrode layer 75 may form a first redistribution layer including a plurality of first layers 72, 73SS, and 75. The first electrode layer 75 may be formed on the first seed structure 73SS. The first seed structure 73SS and the first electrode layer 75 may pass through the first insulation layer 72 and may be connected to the plurality of conductive patterns 65 and the plurality of chip pads 68. The first seed structure 73SS and the first electrode layer 75 may each include a configuration which is similar to the configurations described above with reference to FIGS. 1 to 6 and 9 to 19.

Figure 25:
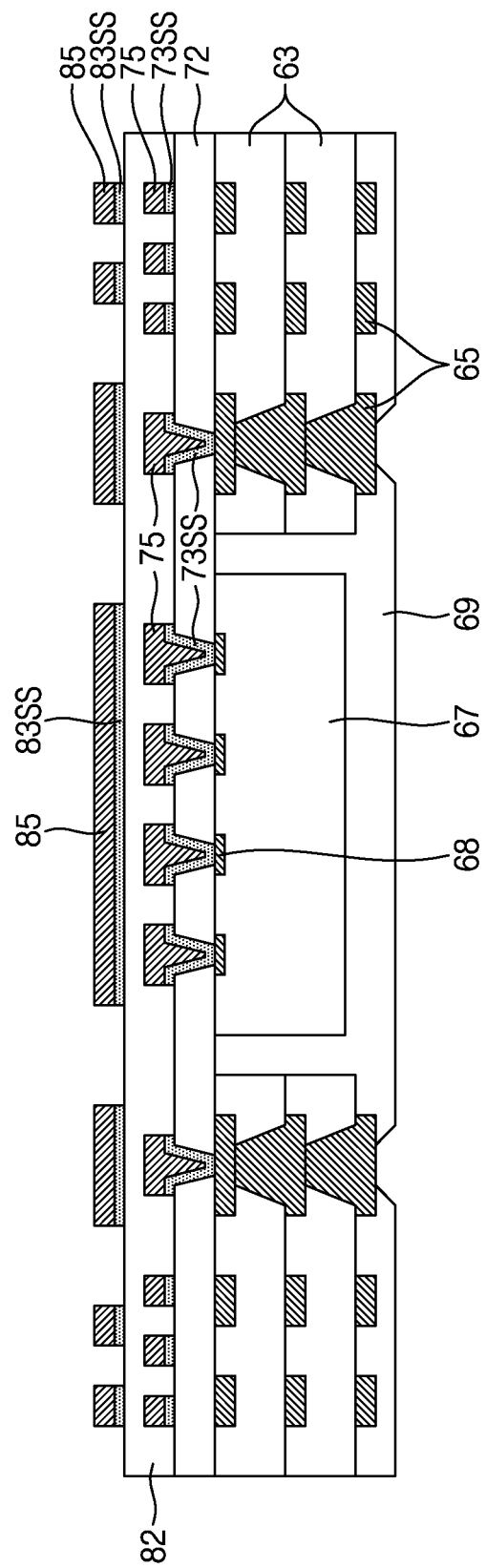

Referring to FIG. 25, a second insulation layer 82 may be formed on the first insulation layer 72. The second insulation layer 82 may cover the plurality of first layers 72, 73SS, and 75 (i.e., the first redistribution layer). The second insulation layer 82 may include a configuration similar to that of the first insulation layer 72. A second seed structure 83SS and a second electrode layer 85 may be formed on the second insulation layer 82. The second electrode layer 85 may be formed on the second seed structure 83SS. The second insulation layer 82, the second seed structure 83SS, and the second electrode layer 85 may form a second redistribution layer including a plurality of second layers 82, 83SS, and 85. The second seed structure 83SS and the second electrode layer 85 may each include a configuration which is similar to the configurations described above with reference to FIGS. 1 to 6 and 9 to 19.

Referring again to FIG. 7, a third insulation layer 92 may be formed on the second insulation layer 82. The third insulation layer 92 may cover the plurality of second layers 82, 83SS, and 85 (i.e., the second redistribution layer). The third insulation layer 92 may include a configuration similar to that of the first insulation layer 72. A third seed structure 93SS and a third electrode layer 95 may be formed on the third insulation layer 92. The third electrode layer 95 may be formed on the third seed structure 93SS. The third insulation layer 92, the third seed structure 93SS, and the third electrode layer 95 may form a third redistribution layer including a plurality of third layers 92, 93SS, and 95.

A fourth insulation layer 97 may be formed on the third insulation layer 92. The fourth insulation layer 97 may cover the plurality of third layers 92, 93SS, and 95 (i.e., the third redistribution layer). The fourth insulation layer 97 may include a configuration similar to that of the first insulation layer 72. A fourth seed structure 98SS and a fourth electrode layer 99 may be formed on the fourth insulation layer 97. The fourth electrode layer 99 may be formed on the fourth seed structure 98SS. The fourth insulation layer 97, the fourth seed structure 98SS, and the fourth electrode layer 99 may form a fourth redistribution layer including a plurality of fourth layers 97, 98SS, and 99 (i.e., a plurality of fourth redistribution layer patterns). The third seed structure 93SS, the third electrode layer 95, the fourth seed structure 98SS, and the fourth electrode layer 99 may each include a configuration which is similar to the configurations described above with reference to FIGS. 1 to 6 and 9 to 19. The fourth electrode layer 99 may include a solder ball such as Sn—Ag—Cu.

Figure 26:
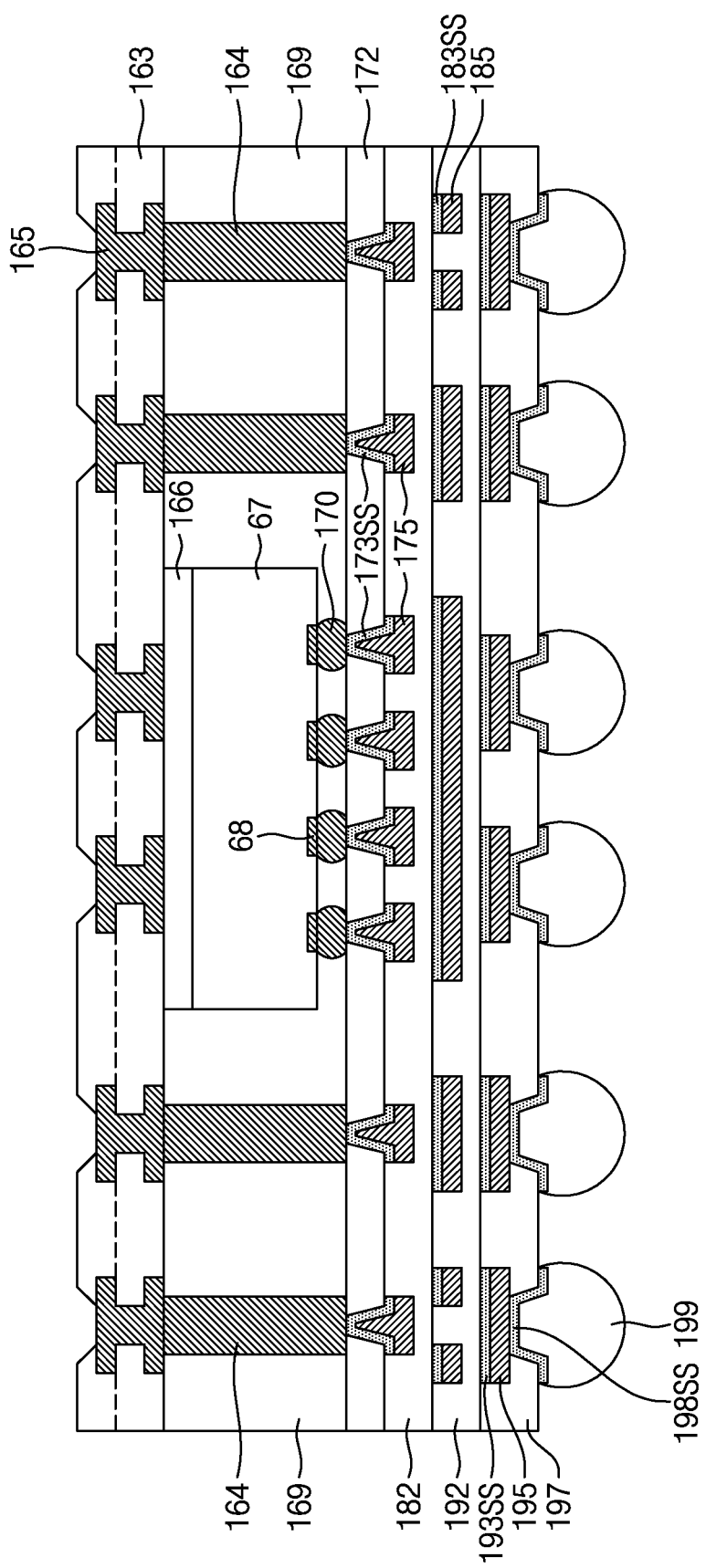
FIGS. 26 and 27 are cross-sectional views for describing semiconductor devices according to embodiments of the disclosure.
Figure 27:
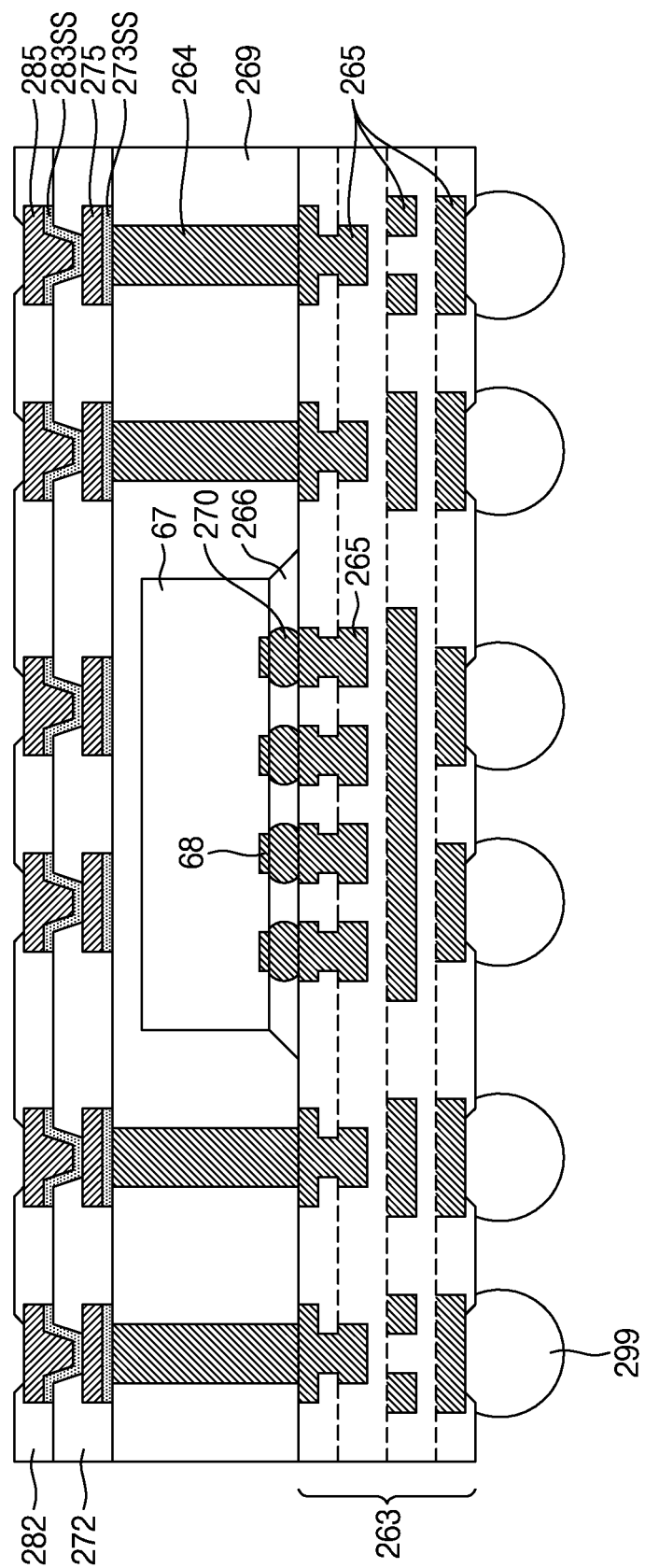

FIGS. 26 and 27 are cross-sectional views for describing semiconductor devices according to embodiments of the disclosure.

Referring to FIG. 26, semiconductor devices according to embodiments of the disclosure may include a semiconductor chip 67, a package substrate 163, a plurality of through electrodes 164, an adhesive layer 166, an encapsulant 169, a plurality of internal connection terminals 170, a plurality of first layers 172, 173SS, and 175 (e.g., first redistribution layer), a plurality of second layers 182, 183SS, and 185 (e.g., second redistribution layer), a plurality of third layers 192, 193SS, and 195 (e.g., third redistribution layer), and a plurality of fourth layers 197, 198SS, and 199 (e.g., fourth redistribution layer).

The semiconductor chip 67 may include a plurality of chip pads 68. The package substrate 163 may include a plurality of conductive patterns 165. The plurality of first layers 172, 173SS, and 175 may include a first insulation layer 172, a first seed structure 173SS, and a first electrode layer 175. The plurality of second layers 182, 183SS, and 185 may include a second insulation layer 182, a second seed structure 183SS, and a second electrode layer 185. The plurality of third layers 192, 193SS, and 195 may include a third insulation layer 192, a third seed structure 193SS, and a third electrode layer 195. The plurality of fourth layers 197, 198SS, and 199 may include a fourth insulation layer 197, a fourth seed structure 198SS, and a fourth electrode layer 199.

In an embodiment, the semiconductor chip 67, the plurality of through electrodes 164, the encapsulant 169, and the plurality of internal connection terminals 170 may correspond to a complex structure. The first seed structure 173SS, the first electrode layer 175, the second seed structure 183SS, the second electrode layer 185, the third seed structure 193SS, the third electrode layer 195, the fourth seed structure 198SS, and the fourth electrode layer 199 may each include a configuration which is similar to the configurations described above with reference to FIGS. 1 to 6. The fourth electrode layer 199 may include a solder ball, a conductive bump, a conductive pillar, a conductive lead, a conductive pin, a conductive finger, or a combination thereof. The fourth electrode layer 199 may be referred to as an external connection terminal. The fourth electrode layer 199 may be electrically connected to the plurality of chip pads 68 or the plurality of through electrodes 164 via the fourth seed structure 198SS, the third electrode layer 195, the third seed structure 193SS, the second electrode layer 185, the second seed structure 183SS, the first electrode layer 175, the first seed structure 173SS, and the plurality of internal connection terminals 170.

The package substrate 163 may include a rigid PCB, a flexible PCB, a rigid-flexible PCB, or a combination thereof. The semiconductor chip 67 may be attached on the package substrate 163 by using the adhesive layer 166. The plurality of through electrodes 164 may be disposed on the plurality of conductive patterns 165. The encapsulant 169 may cover one surface of the package substrate 163. The semiconductor chip 67, the plurality of through electrodes 164, and the plurality of internal connection terminals 170 may be disposed in the encapsulant 169. The plurality of internal connection terminals 170 may pass through the encapsulant 169 and may contact the plurality of chip pads 68.

The plurality of through electrodes 164 may include a Cu post, a conductive bump, a bonding wire, or a combination thereof. The adhesive layer 166 may include a die attach film (DAF), an underfill, an NCF, an NCP, or a combination thereof. The plurality of internal connection terminals 170 may include or may be formed of metal, metal nitride, metal silicide, metal oxide, conductive carbon, or a combination thereof. For example, the plurality of internal connection terminals 170 may include a solder bump.

Referring to FIG. 27, semiconductor devices according to embodiments of the disclosure may include a semiconductor chip 67, a package substrate 263, a plurality of through electrodes 264, an internal encapsulant 266, an encapsulant 269, a plurality of internal connection terminals 270, a plurality of first layers 272, 273SS, and 275 (e.g., first redistribution layer), a plurality of second redistribution layers 282, 283SS (e.g., second redistribution layer), and 285, and a plurality of external connection terminals 299.

The semiconductor chip 67 may include a plurality of chip pads 68. The package substrate 263 may include a plurality of conductive patterns 265. The internal encapsulant 266 may be disposed between the package substrate 263 and the semiconductor chip 67. The plurality of internal connection terminals 270 may pass through the internal encapsulant 266 and may contact the plurality of chip pads 68 and the plurality of conductive patterns 265. The plurality of through electrodes 264 may be disposed on the plurality of conductive patterns 265.

The internal encapsulant 266 may include an underfill, an EMC, an NCF, an NCP, a photosensitive material, or a combination thereof. In an embodiment, the internal encapsulant 266 may include or may be formed of an epoxy resin such as a thermocurable resin, a thermoplastic resin such as polyimide, or a resin where a reinforcing agent such as an inorganic filler is added thereto. For example, the internal encapsulant 266 may include or may be formed of ABF, FR-4, BT, resin, or a combination thereof.

The plurality of first layers 272, 273SS, and 275 may include a first insulation layer 272, a first seed structure 273SS, and a first electrode layer 275. The plurality of second layers 282, 283SS, and 285 may include a second insulation layer 282, a second seed structure 283SS, and a second electrode layer 285. The first seed structure 273SS, the first electrode layer 275, the second seed structure 283SS, and the second electrode layer 285 may each include a configuration which is similar to the configurations described above with reference to FIGS. 1 to 6. The plurality of external connection terminals 299 may include a solder ball, a conductive bump, a conductive pillar, a conductive lead, a conductive pin, a conductive finger, or a combination thereof.

The plurality of external connection terminals 299 may be electrically connected to the plurality of chip pads 68 or the plurality of through electrodes 264. The second electrode layer 285 may be electrically connected to the plurality of chip pads 68 via the second seed structure 283SS, the first electrode layer 275, the first seed structure 273SS, the plurality of through electrodes 264, the plurality of conductive patterns 265, and the plurality of internal connection terminals 270.

According to the embodiments of the disclosure, a process of forming a seed structure may include a process of cleaning a complex structure including a lower barrier layer and a lower seed layer and then forming an upper barrier layer and an upper seed layer. An electrode layer may be formed on the seed structure by using an electroplating process. Accordingly, according to the embodiments of the disclosure, semiconductor devices having an excellent electrical characteristic may be implemented.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Hereinabove, the embodiments of the disclosure have been described with reference to the accompanying drawings, but it may be understood that those skilled in the art may implement the embodiments in another detailed form without changing the inventive concept or the essential feature. It should be understood that the embodiments described above are merely examples in all aspects and are not limited.

What is claimed is:

1. A semiconductor device comprising:
a package structure; and
a seed structure on the package structure, the seed structure includes
a first barrier layer,
a first seed layer on the first barrier layer,
a second barrier layer on the first seed layer, the second barrier layer physically contacts a top surface of the first seed layer and a side surface of the first barrier layer and the first seed layer, and
a second seed layer on the second barrier layer; and
an electrode layer on the seed structure,
wherein each of the first seed layer and the second seed layer comprises copper (Cu).

2. The semiconductor device of claim 1, wherein a bottom surface of the second barrier layer physically contacts the package structure.

3. The semiconductor device of claim 1, wherein lowermost surfaces of the first barrier layer and the second barrier layer are coplanar.

4. The semiconductor device of claim 1, further comprising an undercut area between the package structure and the electrode layer,
wherein a side surface of the seed structure is recessed with respect to the package structure and the electrode layer at an inner portion of the undercut area.

5. The semiconductor device of claim 1, wherein the seed structure has a horizontal width in a first direction which is narrower than a width of the electrode layer in the first direction.

6. The semiconductor device of claim 1, wherein each of the first barrier layer and the second barrier layer comprises titanium (Ti), titanium nitride (TiN), tantalum (Ta), tantalum nitride (TaN), or a combination thereof.

7. The semiconductor device of claim 1, wherein the electrode layer comprises copper (Cu), nickel (Ni), tin-silver-copper (Sn—Ag—Cu), cobalt (Co), tungsten (W), or a combination thereof.

8. The semiconductor device of claim 1, wherein the seed structure further comprises:
a third barrier layer on the second seed layer; and
a third seed layer on the third barrier layer.

9. The semiconductor device of claim 1, wherein
the seed structure has a thickness of 4 nm to 600 nm,
each of the first barrier layer and the second barrier layer has a thickness of 1 nm to 150 nm, and
each of the first seed layer and the second seed layer has a thickness of 1 nm to 150 nm.

* * * * *